US008324796B2

(12) United States Patent
Matsuki et al.

(10) Patent No.: US 8,324,796 B2
(45) Date of Patent: Dec. 4, 2012

(54) LIGHTING DEVICE WITH PHOSPHOR LAYER AND LENS, AND SURFACE LIGHT SOURCE, AND LIQUID-CRYSTAL DISPLAY

(75) Inventors: Daizaburo Matsuki, Osaka (JP); Syunsuke Kimura, Hyogo (JP); Tomoko Iiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 277 days.

(21) Appl. No.: 12/829,947

(22) Filed: Jul. 2, 2010

(65) Prior Publication Data

US 2011/0013116 A1 Jan. 20, 2011

(30) Foreign Application Priority Data

Jul. 3, 2009 (JP) ................. 2009-158716

(51) Int. Cl.
*G02F 1/13357* (2006.01)
*F21V 21/00* (2006.01)
*F21V 11/00* (2006.01)

(52) U.S. Cl. ........ 313/501; 313/504; 313/506; 313/512; 445/24; 257/40; 315/169.1

(58) Field of Classification Search .......... 313/498–512; 257/40, 269, 72, 98–100, 642–643, 759; 315/169.1, 169.3; 428/690–691, 917; 438/26–29, 438/34, 82
See application file for complete search history.

(56) References Cited

U.S. PATENT DOCUMENTS

| 7,175,328 | B2 | 2/2007 | Leu et al. | |
| 7,348,723 | B2 | 3/2008 | Yamaguchi et al. | |
| 7,479,662 | B2 * | 1/2009 | Soules et al. | 257/98 |
| 7,534,025 | B2 | 5/2009 | Harbers et al. | |
| 2004/0223315 | A1 * | 11/2004 | Suehiro et al. | 362/84 |
| 2005/0179064 | A1 | 8/2005 | Nawashiro et al. | |
| 2006/0186431 | A1 | 8/2006 | Miki et al. | |
| 2007/0096113 | A1 | 5/2007 | Inoshita et al. | |
| 2007/0216311 | A1 * | 9/2007 | Cernasov et al. | 315/3 |

FOREIGN PATENT DOCUMENTS

| JP | 2002-175713 | 6/2002 |
| JP | 2002-352611 | 12/2002 |
| JP | 3875247 | 11/2006 |
| JP | 2007-116131 | 5/2007 |
| JP | 2008-98162 | 4/2008 |
| JP | 2008-545269 | 12/2008 |
| WO | 2007/005013 | 1/2007 |

* cited by examiner

*Primary Examiner* — Tracie Y Green
(74) *Attorney, Agent, or Firm* — Hamre, Schumann, Mueller & Larson, P.C.

(57) ABSTRACT

A lighting device includes a light emitting element that emits a first colored light; a phosphor layer disposed on the light emitting element; and a lens part that is disposed so as to cover the light emitting element and the phosphor layer, and radiates light entering inside of the lens part so as to spread the light radially. The phosphor layer allows a part of the first colored light to transmit therethrough and converts another part of the first colored light into a second colored light having a wavelength longer than that of the first colored light. The lens part has: a base portion forming a light entrance surface through which the first colored light and the second colored light enter the lens part; and a diffraction portion forming a light exit surface through which the first colored light and the second colored light exit the lens part, the diffraction portion being configured so that a refracting power with respect to the second colored light is larger than a refracting power with respect to the first colored light.

10 Claims, 12 Drawing Sheets

LIGHTING DEVICE WITH PHOSPHOR LAYER AND LENS, AND SURFACE LIGHT SOURCE, AND LIQUID-CRYSTAL DISPLAY

BACKGROUND OF THE INVENTION

1. Field of the Invention

The present invention relates to a lighting device used, for example, in a backlight of a liquid-crystal display apparatus, a surface light source including the lighting device, and a liquid-crystal display apparatus including the surface light source.

2. Description of Related Art

In a backlight of a conventional large-sized liquid-crystal display apparatus, a number of cold cathode tubes are disposed right under a liquid crystal panel, and these cold cathode tubes are used together with members such as a diffusing plate and a reflecting plate. In recent years, light emitting diodes (hereinafter referred to as "LEDs") have been used as light sources for backlights. LEDs have increased their efficiency recently, and are expected to serve as low-power light sources to replace fluorescent lamps. In the case where LEDs are used as a light source in a liquid-crystal display apparatus, the power consumption of the apparatus can be reduced by controlling the light and dark states of the LEDs according to an image to be displayed.

In a backlight of a liquid-crystal display apparatus using LEDs as a light source, a large number of LEDs are disposed therein instead of cold cathode tubes. The use of a large number of LEDs allows the entire surface of the backlight to have uniform brightness, but the need for such a large number of LEDs is an obstacle to cost reduction. Attempts to increase the output power of each LED to reduce the required number of LEDs have been made. For example, JP 3875247 B proposes a surface light source in which a lighting device including a lens for widening a range of transmission directions of LEDs is disposed behind a diffusing plate.

For another example, JP 2002-352611 A proposes a configuration using a light direction conversion element for directing the traveling direction of light rays emitted from a light source to the normal direction to a backlight exit surface, as a configuration allowing the surface of the backlight to have uniform brightness.

When configuring a surface light source to be used in a backlight of a liquid-crystal display apparatus, it is preferable to employ a lighting device that emits white light. For example, JP 2008-545269 T discloses a lighting device as shown in FIG. 12. In this lighting device, a blue LED that emits blue light is used as the LED, and a phosphor layer 102 is disposed between a blue LED 101 and a lens 103. The phosphor layer 102 converts a part of the blue light into yellow light, so that white light is generated using the blue light.

In the lighting device as shown in FIG. 12, the phosphor layer 102 has larger surface dimensions than those of the blue LED 101. In such a configuration, the blue light emitted from the blue LED 101 and the yellow light exiting the phosphor layer 102 have different light paths to reach a light exit surface of the lens. This makes the illuminance distribution of the yellow light different from that of the blue light in an area to be irradiated with the lights, resulting in unevenness of color.

Moreover, the configuration disclosed in JP 2002-352611 A is a configuration for making the brightness uniform and is not effective in reducing the unevenness of color.

SUMMARY OF THE INVENTION

In view of the foregoing, the present invention is intended to provide a lighting device capable of suppressing the occurrence of unevenness of color, a surface light source including the lighting device, and a liquid-crystal display apparatus using the surface light source.

In order to solve the aforementioned problems, the present invention provides a lighting device comprising: a light emitting element that emits a first colored light; a phosphor layer that is disposed on the light emitting element and has a size allowing the phosphor layer to protrude around the light emitting element, the phosphor layer allowing a part of the first colored light to transmit therethrough and converting another part of the first colored light into a second colored light having a wavelength longer than that of the first colored light; and a lens part that is disposed so as to cover the light emitting element and the phosphor layer, and radiates light entering inside of the lens part so as to spread the light radially. The lens part has: a base portion forming a light entrance surface through which the first colored light and the second colored light enter the lens part; and a diffraction portion forming a light exit surface through which the first colored light and the second colored light exit the lens part, the diffraction portion being configured so that a refracting power with respect to the second colored light is larger than a refracting power with respect to the first colored light.

The surface light source of the present invention includes: a plurality of the lighting devices arranged in a matrix or in a staggered manner; and a diffusing plate disposed so as to cover the lighting devices.

The liquid-crystal display apparatus of the present invention includes: a liquid crystal panel; and the surface light source disposed behind the liquid crystal panel.

The present invention can provide the lighting device capable of suppressing the occurrence of unevenness of color, the surface light source including the lighting device, and the liquid-crystal display apparatus including the surface light source.

DETAILED DESCRIPTION OF THE INVENTION

Hereinafter, embodiments of the present invention will be described with reference to the drawings.

<Surface Light Source>

Figure 1:
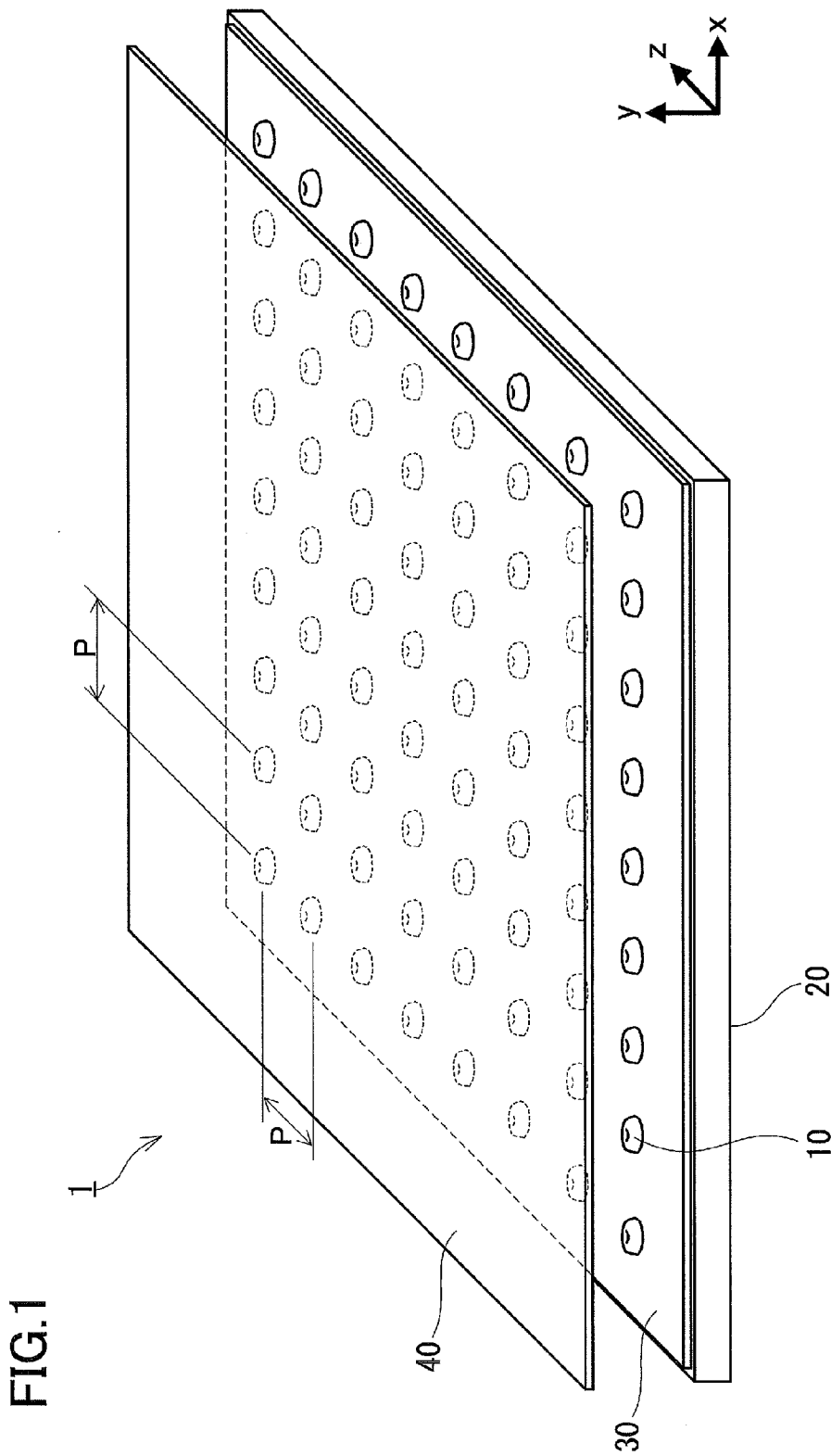
FIG. 1 is a schematic perspective view of a surface light source according to one embodiment of the present invention.
Figure 2:
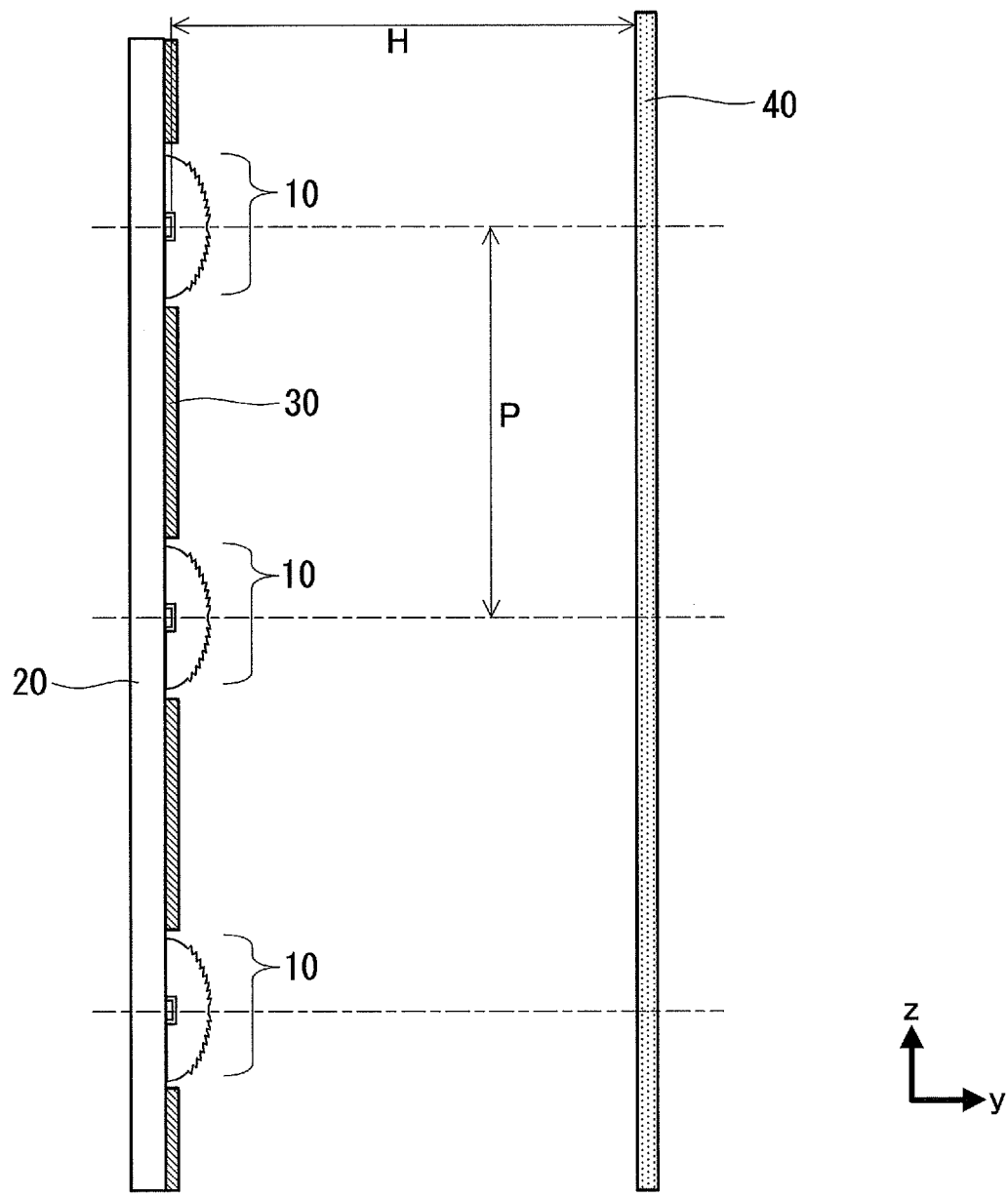
FIG. 2 is a partial cross-sectional view of the surface light source shown in FIG. 1.

FIG. 1 is a schematic perspective view of a surface light source 1 having a plurality of lighting devices 10 according to one embodiment of the present invention. FIG. 2 is a partial cross-sectional view of the surface light source 1 taken along the y-z plane including an optical axis of the lighting device 10. FIG. 1 and FIG. 2 each show only a characteristic configuration of the present embodiment, and drawings about other parts are omitted. As stated herein, the direction of the x axis is referred to as a "lateral direction" or a "horizontal direction", the positive direction of the y axis, which is the direction in which the surface light source 1 emits light, is referred to as a "front direction" or a "forward direction", the negative direction of the y axis is referred to as a "back direction" or a "backward direction", the positive direction of the z axis is referred to as an "upward direction", and the negative direction of the z axis is called a "downward direction". In each component, a surface on a side of the front direction may be called a "forward surface" or a "front surface".

The surface light source 1 includes: the lighting devices 10 arranged in a matrix; a substrate 20 on which the lighting devices 10 are mounted; a reflective layer 30 provided on a front surface of the substrate 20 in such a manner that the lighting devices 10 are exposed; and a diffusing plate 40 disposed away from the substrate 20 with a predetermined distance therebetween so as to cover the lighting devices 10. The lighting devices 10 may be arranged in a staggered manner.

Figure 3:
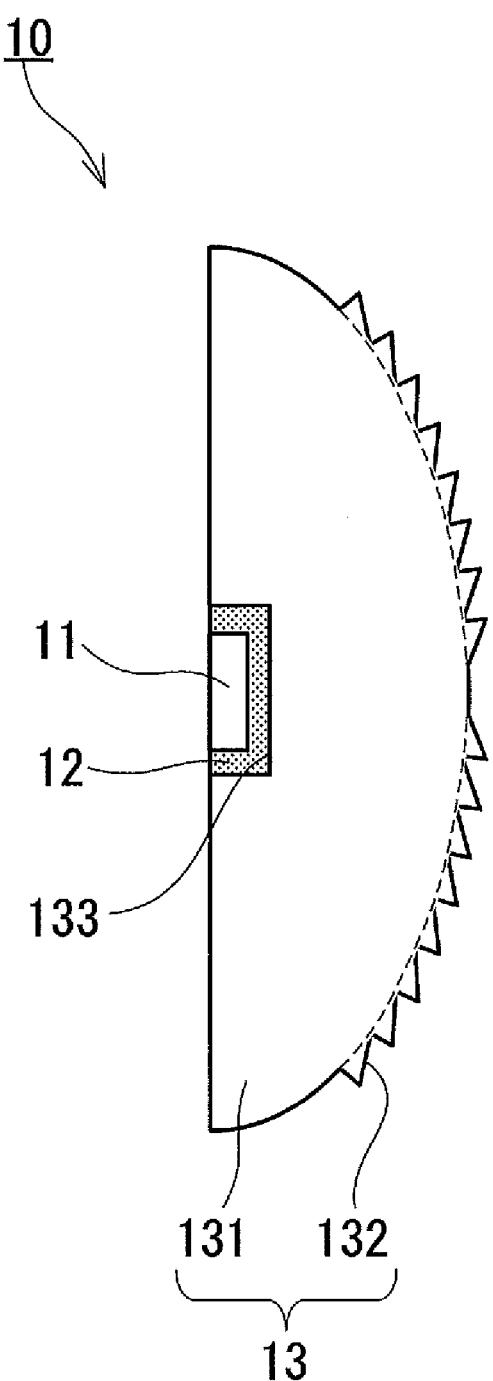
FIG. 3 is a cross-sectional view of a lighting device used in the surface light source shown in FIG. 1.

As shown in FIG. 3, the lighting devices 10 each include: a blue LED 11 as a light emitting element; a phosphor layer 12 disposed on the blue LED 11; and a lens part 13 that is disposed so as to cover the blue LED 11 and the phosphor layer 12, and radiates light entering inside of the lens part 13 so as to spread the light radially.

The blue LED 11 emits blue light that is a first colored light. The phosphor layer 12 has a phosphor. The phosphor is excited by the blue light and converts the blue light into yellow light that is a second colored light. The phosphor layer 12 allows a part of the blue light emitted from the blue LED 11 to transmit therethrough and converts another part of the blue light into the yellow light. The rest of the blue light emitted from the blue LED 11 is reflected to a blue LED 11 side or converted into heat. The blue light has a complementary color relationship with the yellow light resulting from the conversion, and these colors form white light when mixed with each other. As stated herein, the white color refers to a color having a color temperature in the range of 3,000 K to 10,000 K.

Preferably, the blue light emitted from the blue LED 11 has a peak wavelength in the wavelength range of 400 nm to 520 nm, and more preferably in the wavelength range of 450 nm to 500 nm. In contrast, the yellow light exiting the phosphor layer 12 preferably has a peak wavelength in a wavelength range of 550 nm to 610 nm, and more preferably in a wavelength range of 570 nm to 590 nm.

Figure 4:
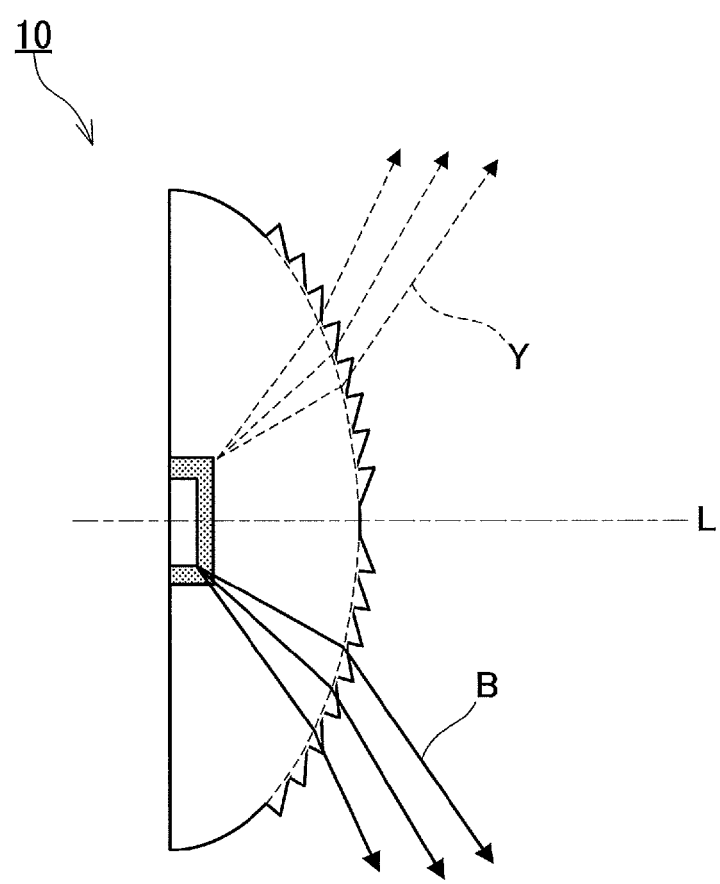
FIG. 4 is a diagram illustrating light emitted from the lighting device.

The phosphor layer 12 is formed on the blue LED so as to have a size allowing the phosphor layer 12 to protrude around the blue LED. Thus, the emission dimensions of the yellow light are larger than the emission dimensions of the blue light. Specifically, as shown in FIG. 4, yellow light Y, which exits the phosphor layer 12, has a component that exits from a location farther from an optical axis L compared to blue light B that is emitted from the blue LED 11.

The blue light and the yellow light that have exited the phosphor layer 12 are spread radially by the lens part 13. Specifically, the blue light is refracted in a direction in which an angle between the optical axis L and itself is increased, and the yellow light also is refracted in a direction in which an angle between the optical axis L and itself is increased. Thereby, the range over which these lights travel is broadened.

The light generation in the blue LED 11 has no directivity in itself, and a light emitting region has a refractive index of 2.0 or more. When light from the light emitting region enters a low refractive region, the refraction of the light at the interface causes the light to have the maximum intensity in the normal direction to the interface and to have a lower intensity as the angle between the light and the normal increases. As described above, since the blue LED 11 has directivity, it is necessary to widen the range of transmission directions for light therefrom using the lens part 13 to illuminate a larger area.

Usually, the blue LED 11 and the phosphor layer 12 are covered with a sealing resin. However, since the lens 13 serves as the sealing resin, it is not necessary to provide an additional sealing resin. An epoxy resin or silicone rubber is used as a sealing resin for a conventional LED.

The lens part 13 is made of a transparent material having a predetermined refractive index. The refractive index of the transparent material is, for example, about 1.40 to 1.53. Examples of such a transparent material include resins such as epoxy resin, silicone resin, acrylic resin, and polycarbonate, and rubbers such as silicone rubber. Particularly, it is preferable to use an epoxy resin, silicone rubber, or the like that has been used as a sealing resin for an LED.

The lens part 13 has: a base portion 131 forming a light entrance surface 133 through which the blue light and the yellow light enter the lens part 13; and a diffraction portion 132 forming a light exit surface through which the blue light and the yellow light exit the lens part 13. The lens part 13 in the present embodiment has a configuration in which the base portion 131 and the diffraction portion 132 are formed integrally.

The base portion 131 has, on a side opposite to the light entrance surface 133, a surface forming a continuous curved surface that is convex to the diffraction portion 132 as a whole. The surface of the base portion 131 may be a spherical surface or an aspherical surface. Moreover, the surface of the base portion 131 may be rotationally symmetric with respect to the optical axis L, or may not be rotationally symmetric with respect to the optical axis L (may be elliptical when viewed from an optical axis direction, for example).

In contrast, the diffraction portion 132 changes the emission angle of the light due to its diffracting effect, depending on the angle and color (wavelength) of the light that has reached the diffraction portion 132. More specifically, the diffraction portion 132 is configured so that a refracting power with respect to the yellow light, which is the second colored light, is larger than a refracting power with respect to the blue light, which is the first colored light. As stated herein, the refracting power means the inverse (1/f) of a focal distance (f) when light parallel to the optical axis direction enters the diffraction portion 132 through an input surface of the diffraction portion 132 (in the present embodiment, it is a surface in contact with the surface of the base portion 131) and exits the diffraction portion 132 through an output surface of the diffraction portion 132. Thus, the diffraction portion 132 functions to reduce the difference between a distribution of light (an illuminance distribution) observed when a light entrance surface of the diffusing plate 40, which is a surface to be irradiated, is irradiated with the blue light and a distribution of light observed when the light entrance surface of the diffusing plate 40 is irradiated with the yellow light.

In the lighting device 10, the emission dimensions of the blue light are different from that of the yellow light as described above, and as a result, these lights exhibit different distributions of light from each other on the surface to be irradiated. That is, the unevenness of color occurs. The diffraction portion 132 can reduce the difference between these distributions of light, and as a result, can reduce the unevenness of color.

Referring back to FIG. 2, the reflective layer 30 has openings at portions corresponding to the lighting devices 10, and is attached onto the substrate 20 in such a manner that the lighting devices 10 are exposed. The reflective layer 30 reflects the light that has been emitted from the lighting devices 10 and returned thereto by being reflected by the diffusing plate 40, etc. again toward the diffusing plate 40. The reflective layer 30 has a white diffusion reflection surface facing the diffusing plate 40.

The diffusing plate 40 is disposed facing the substrate 20. The diffusing plate 40 diffuses the light that enters inside of the diffusing plate 40 from a back surface thereof. A part of the diffused light transmits through the diffusing plate 40 and exits from a front surface of the diffusing plate 40. Another part of the diffused light returns to a back direction due to reflection. In the diffusing plate 40, the blue light and the yellow light that have entered thereinto are mixed further by the diffusing effect and form approximately uniform white light. Then the white light exits the diffusing plate 40 from a front surface side of the diffusing plate 40.

So far, the basic configuration of the surface light source 1 according to the present embodiment has been described. Hereinafter, a preferred configuration of the surface light source 1 will be described.

Preferably, the lens part 13 has a refractive index exceeding 1.40 but less than 1.52. 1.52 or more for the refractive index of the lens part 13 increases the refracting effect at the light exit surface, making the broad distribution of light flux insufficient. In contrast, 1.40 or less of the refractive index of the lens 13 reduces the refracting effect at the light exit surface. If the shape of the light exit surface is changed in order to increase the refracting effect, it is difficult to meet the tolerance requirements.

Furthermore, when a pitch of the lighting devices 10 is denoted as P and a distance from the blue LED 11 to the diffusing plate 40 is denoted as H, the surface light source 1 satisfies preferably a formula below.

$$0.2 < H/P < 0.6$$

Figure 5:
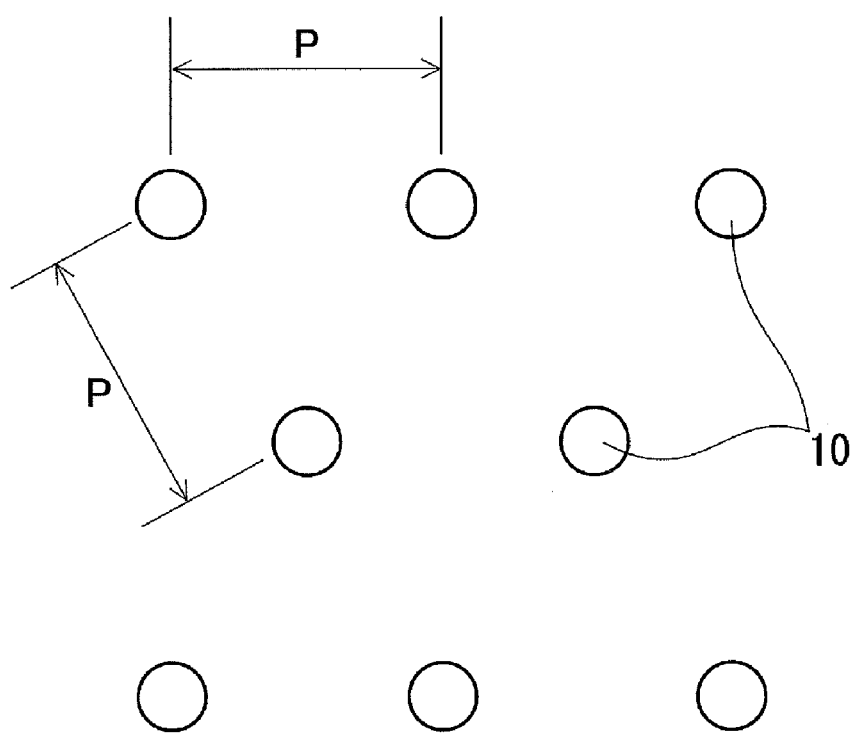
FIG. 5 is a plan view showing another arrangement of the lighting devices.

As stated herein, the "pitch P of the lighting devices 10" means the distance between the optical axes of the adjacent lighting devices 10 in the direction in which the lighting devices 10 are aligned. There are two orthogonal directions of alignment of the lighting devices 10, that is, lateral and vertical directions in the case where they are arranged in a matrix as shown in FIG. 1. There are two directions of alignment of the lighting devices 10, that is, lateral and oblique directions in the case where they are arranged in a staggered manner as shown in FIG. 5. The pitch in one direction does not necessarily have to coincide with that in the other direction, but preferably, the pitches in these two directions coincide with each other.

If the value of H/P is 0.6 or more, the distance between each of the lighting devices 10 and the diffusing plate 40 is increased with respect to the pitch P of the lighting devices 10, which increases the surface light source in size. If the value of H/P is 0.2 or less, it is difficult to maintain the uniformity in the illuminance distribution on the back surface of the diffusing plate 40, which causes unevenness in brightness. More preferably, H/P is less than 0.4.

Example

Hereinafter, an example is given as a specific numerical example of the lens part used in the surface light source 1. In the example, the units of lengths are all millimeters (mm), and the units of angles are all degrees (°) in Tables below. In the surface data in the example, r is a curvature radius, d is a distance between the surfaces or a thickness of the lens part, and n is a refractive index with respect to λ=470 nm. In the example, the surface of the base portion (that is, an interface between the base portion and the diffraction portion) is an aspherical surface, and the shape of the surface is defined by the following equation:

$$X = \frac{Ch^2}{1 + \sqrt{1 - (1 + K)C^2 h^2}} + \sum A_n h^n \quad \text{[Equation 1]}$$

where X is the distance from a point on an aspherical surface with a height h from the optical axis to a tangential plane at the vertex of the aspherical surface, h is the height from the optical axis, C is the curvature at the vertex of the aspherical surface (C=1/R), K is the conical constant, and An is the n-th order aspherical coefficient.

When a phase function is denoted as φ(h), and the height from the optical axis is denoted as h with the intersection of the optical axis and the light exit surface of the lens part being the origin point, the diffraction portion is defined by a formula below.

$$\phi(h) = \frac{2\pi}{\lambda}\left(\sum C_n h^{2n}\right) \quad \text{[Equation 2]}$$

where h is the height from the optical axis, Cn is a phase polynomial coefficient, and λ is 470 nm.

The lens part of the present example has a cross-sectional shape corresponding to a cross-sectional shape shown in FIG. 3. The present example is an example of a lens part designed to broaden the range in which the blue light and the yellow light travel while suppressing the unevenness of color caused by their illuminance distributions (the distributions of light), assuming that the blue light (with a wavelength of 470 nm) is emitted from the blue LED having a 0.5 mm-square light emission surface and the yellow light (with a wavelength of 590 nm) exits the phosphor layer having a 0.65 mm-square light emission surface. The lens part has a refractive index of 1.417. Table 1 shows the surface data of the base portion in the lens part of the present example, and Table 2 shows the aspherical surface data thereof.

TABLE 1

Surface data

| Surface type | r | d | n |
|---|---|---|---|
| Light entrance surface | ∞ | 1.2 | 1.417 |
| Surface | −2.29057 | 6.8 | |
| Diffusing plate | ∞ | | |

TABLE 2

Aspherical surface data

K = 1.4339

Table 3 shows the phase polynomial coefficients of the diffraction portion in the lens part of the present example.

TABLE 3

Figure 6:
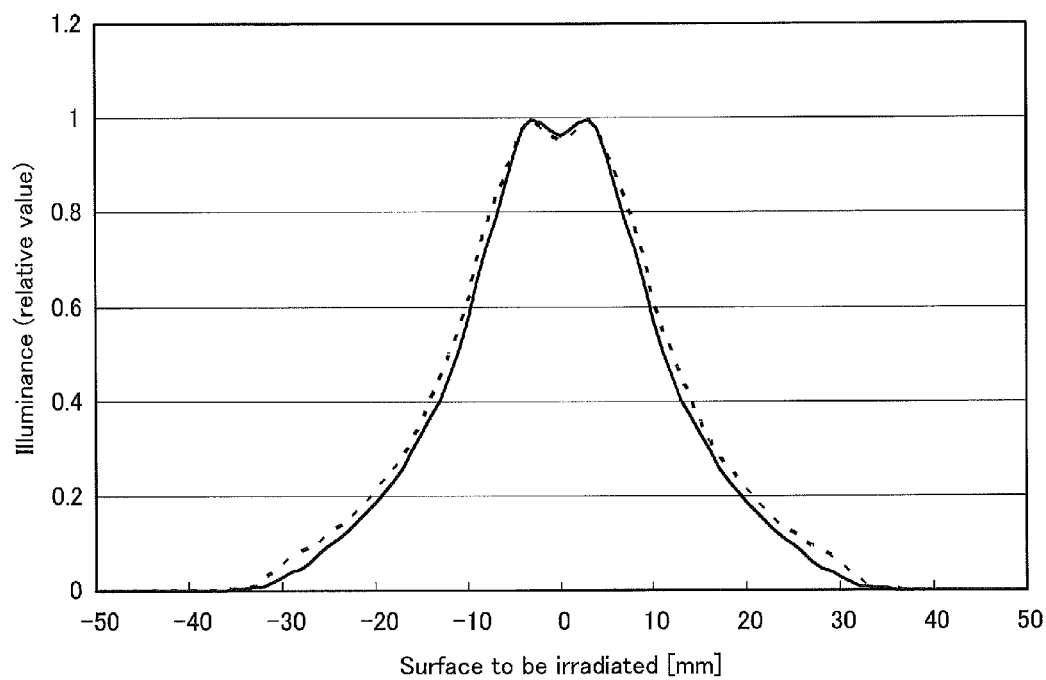
FIG. 6 is a diagram showing an illuminance distribution of a lighting device employing a lens part according to an example.
Figure 7:
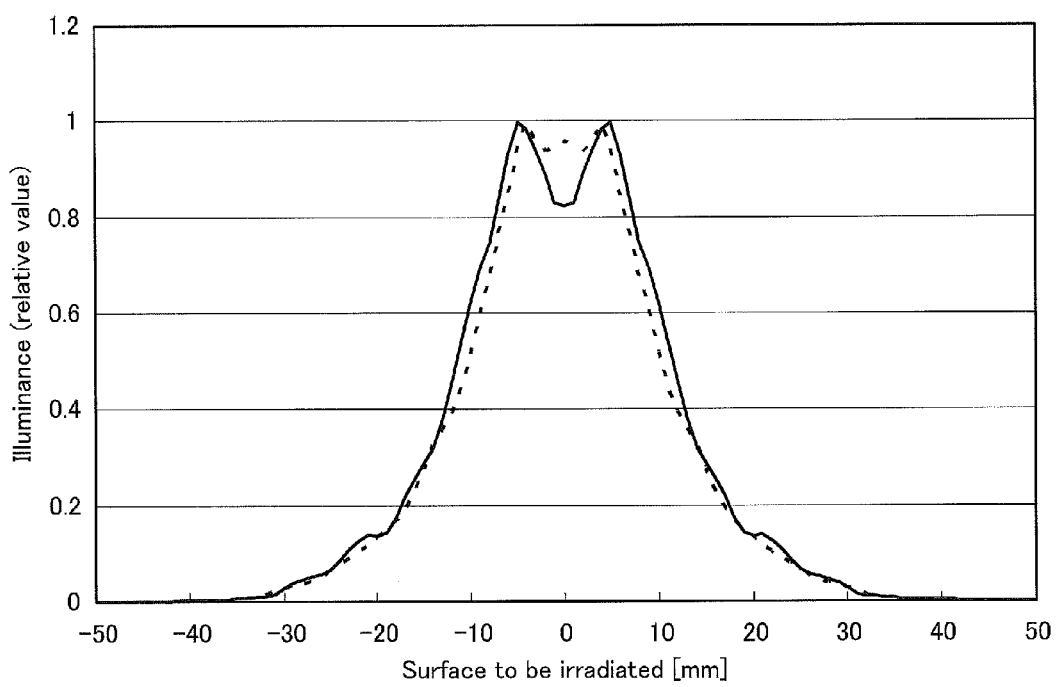
FIG. 7 is a diagram showing an illuminance distribution of a lighting device employing a lens obtained by omitting a diffraction portion from the lens part according to the example.
Figure 8:
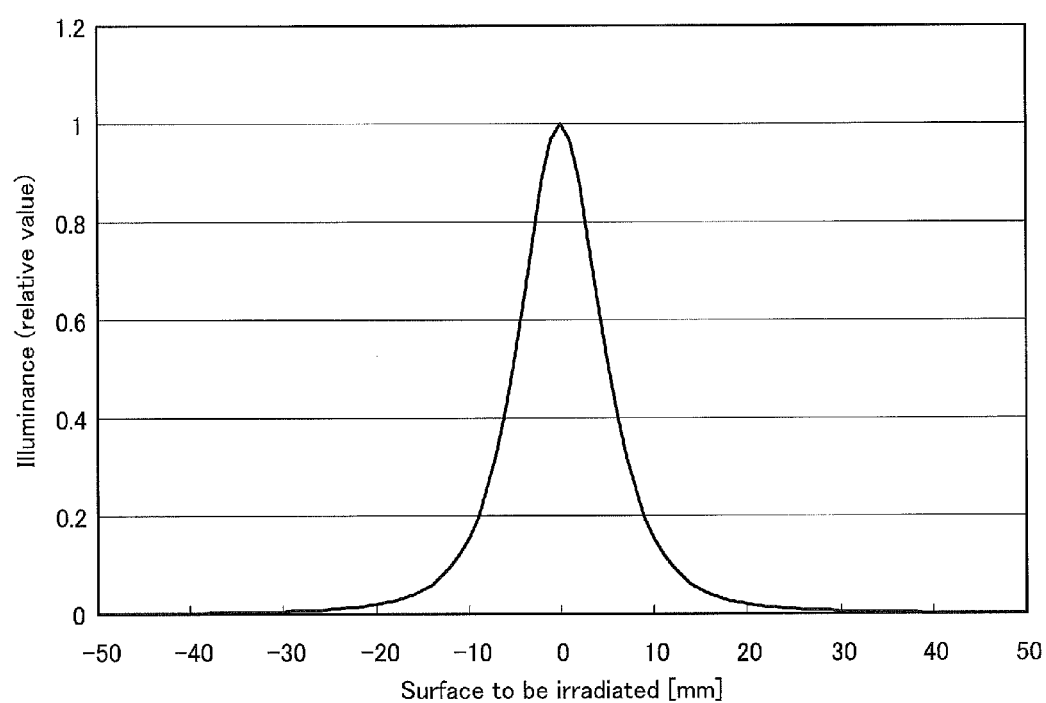
FIG. 8 is a diagram showing an illuminance distribution of a lighting device employing a conventional shell-type lens.

Phase polynomial coefficients $C1 = 4.6996E-01$, $C2 = -7.7459E-01$, $C3 = 1.1120E+00$
$C4 = -6.3412E-01$, $C5 = -7.6651E-01$, $C6 = 1.6392E+00$
$C7 = -1.2505E+00$, $C8 = 4.8621E-01$, $C9 = -9.4687E-02$
$C10 = 7.1650E-03$ FIG. 6 shows calculated illuminance distributions when the lens part of the present example is provided, and the diffusing plate as the surface to be irradiated is disposed at a position 8 mm away from the blue LED. FIG. 7 shows illuminance distributions in the case where a lens obtained by omitting the diffraction portion from the lens part of the present example, which corresponds to a conventional broad light distribution lens, is used, although the configuration thereof is similar to that in the case of FIG. 6. Additionally, for a comparison, FIG. 8 shows illuminance distributions in the case of using a conventional shell-type lens (a lens with a cylindrical shape extending in an optical axis direction, with one end face being hemispherical) without the function of the broad distribution of light. In each of the figures, the solid line designates the illuminance distribution of the blue light, and a dashed line designates the illuminance distribution of the yellow light. In FIG. 8, the solid line and the dashed line almost coincide with each other.

In FIG. 7, the lights exhibit broader distributions of light than in FIG. 8. However, in FIG. 7, the illuminance of the yellow light is higher than that of the blue light at the vicinity of the optical axis. In this case, the unevenness of color occurs at the vicinity of the optical axis. In contrast, in FIG. 6, the illuminance distribution of the yellow light coincides with that of the blue light while the effect of the broad distribution of light comparable to that in the case of FIG. 7 is achieved. This indicates that the unevenness of color is suppressed sufficiently.

When the lens part of the present example is used, the lighting devices can be disposed in a matrix or in a staggered manner so that the pitch P satisfies H/P=0.291, for example.

(Modification)

Figure 9:
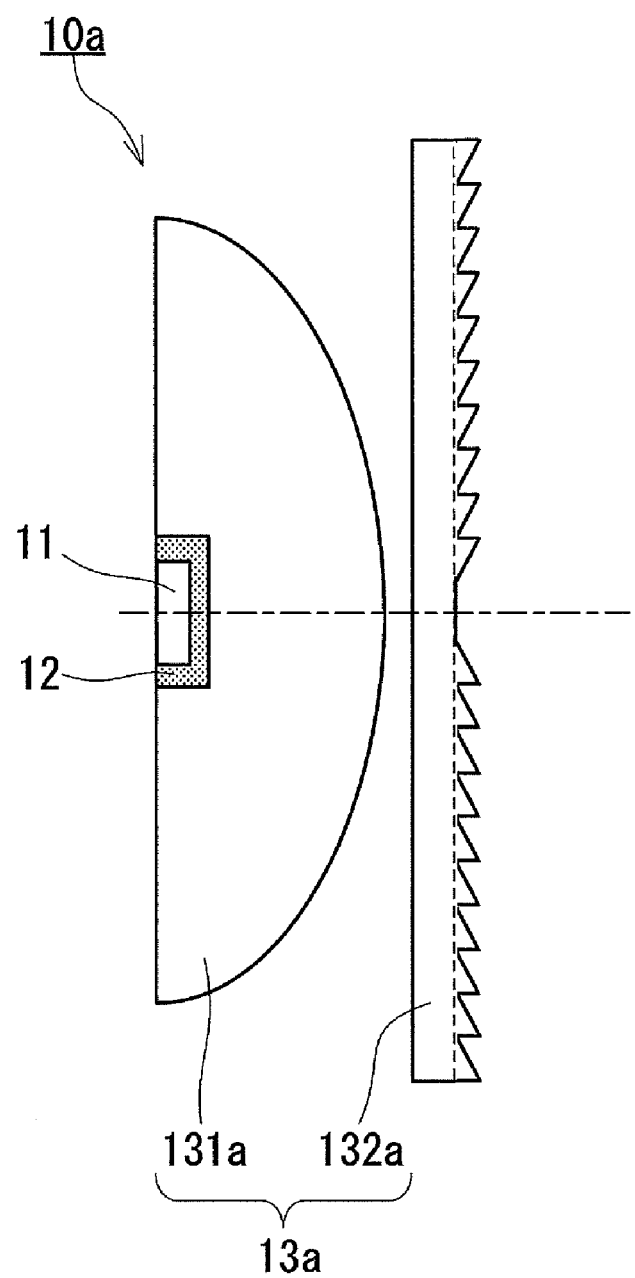
FIG. 9 is a cross-sectional view of a modified lighting device

Although the lens part 13 having a configuration in which the base portion 131 and the diffraction portion 132 are formed integrally is employed in the above-mentioned embodiment, a lens part 13a can be configured with two lenses as in a modified lighting device 10a shown in FIG. 9. Specifically, the lens part 13a shown in FIG. 9 has a configuration in which a base portion 131a and a diffraction portion 132a are separate bodies. In this way, a surface of the base portion 131a and an input surface of the diffraction portion 132a may be spaced apart from each other.

Although the base portion 131 of the lens part 13 has an approximately hemispherical shape in the present embodiment, it is not necessarily limited to this shape. For example, the base portion 131 may be shaped to have a recess at a central portion of the surface including the optical axis. Such a shape allows the lights to have further broader distributions of light.

Moreover, although the phosphor layer 12 has the phosphor that converts the blue light into the yellow light in the present embodiment, the configuration is not limited to this. For example, the phosphor layer 12 may have a phosphor that converts the blue light into red light and a phosphor that converts the blue light into green light. More specifically, the second colored light of the present invention may include red light and green light. This configuration allows the blue light that has been emitted from the light emitting element to mix with the red light and the green light that have exited the phosphor layer to generate white light.

Furthermore, as the light emitting element of the present invention, a red LED that emits red light or a green LED that emits green light can be employed instead of the blue LED 11 that emits blue light. More specifically, the first colored light of the present invention is not limited to the blue light. Alternatively, the light emitting element of the present invention may be an organic EL device, for example.

In the phosphor layer of the present invention, the colored light generated when the first colored light and the second colored light are mixed does not necessarily have to be white light and may be light with another particular color.

The light entrance surface of the lens part does not necessarily have to be in contact with the phosphor layer. More specifically, an air layer may be interposed between the phosphor layer and the light entrance surface. Furthermore, the shape of the light entrance surface is not limited to a flat shape. For example, it may be a spherical surface or an aspherical surface such as an elliptical surface.

<Liquid-Crystal Display Apparatus>

Figure 10:
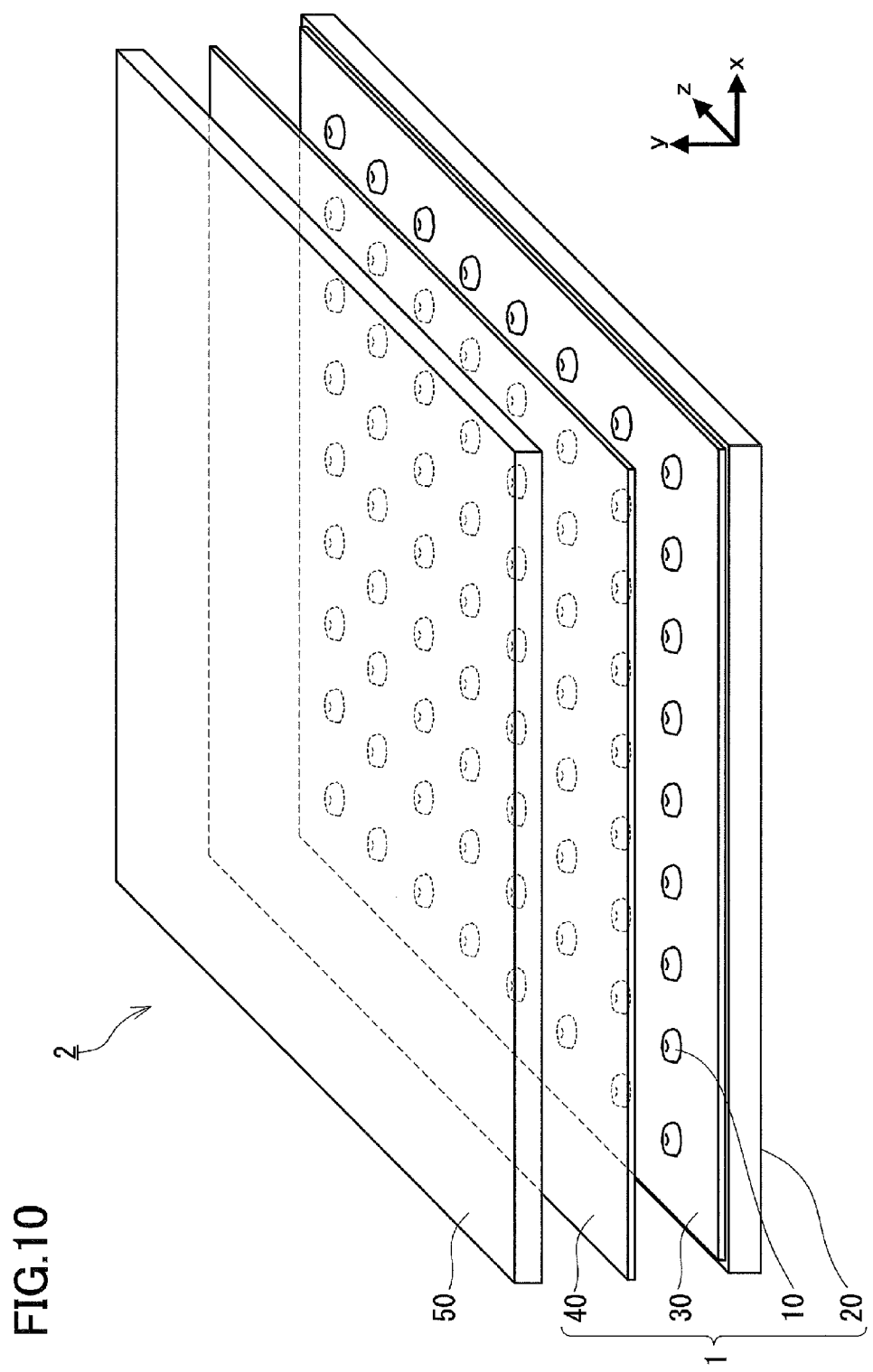
FIG. 10 is a schematic perspective view of a liquid-crystal display apparatus according to one embodiment of the present invention.
Figure 11:
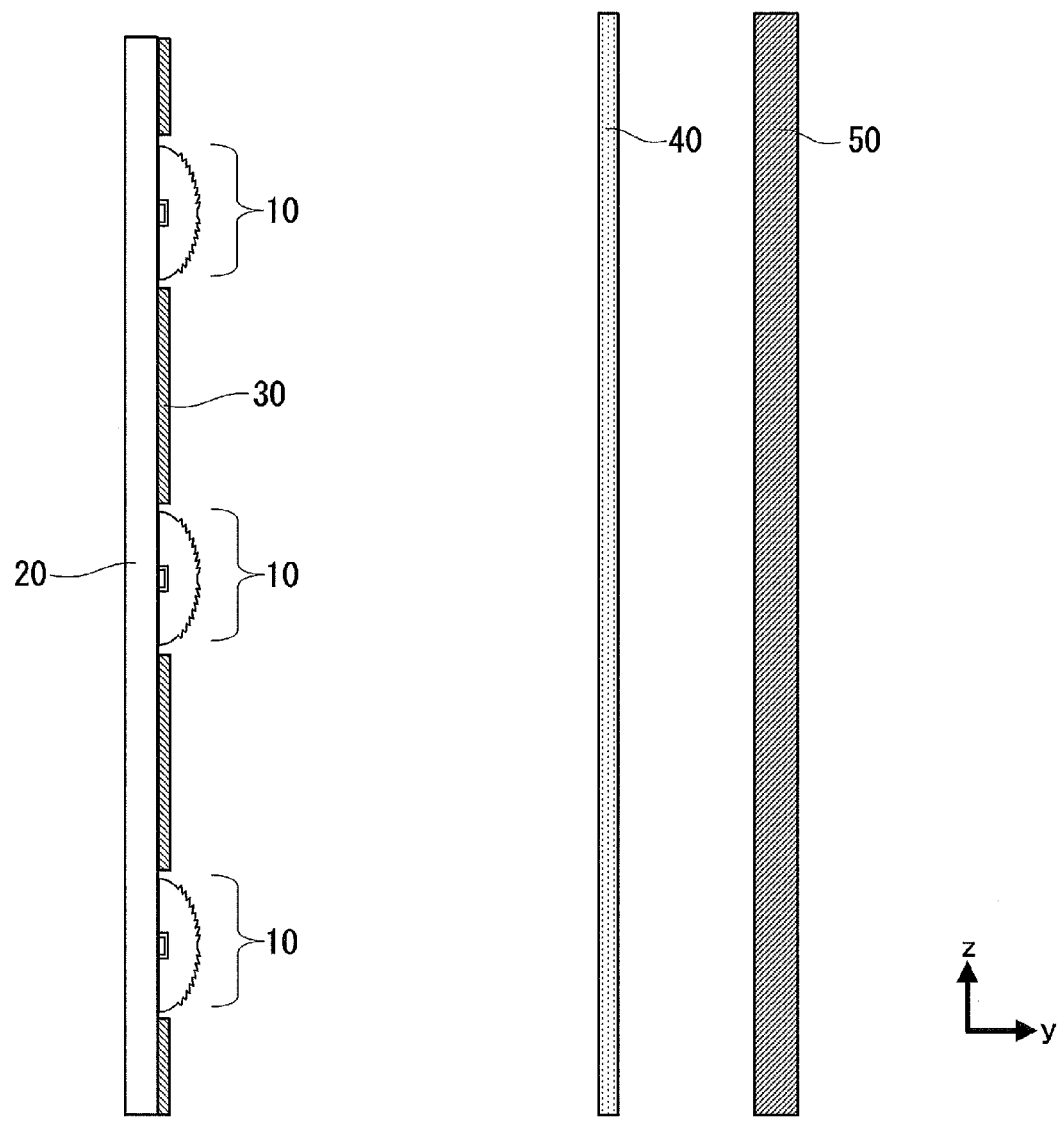
FIG. 11 is a partial cross-sectional view of the liquid crystal display shown in FIG. 10.
Figure 12:
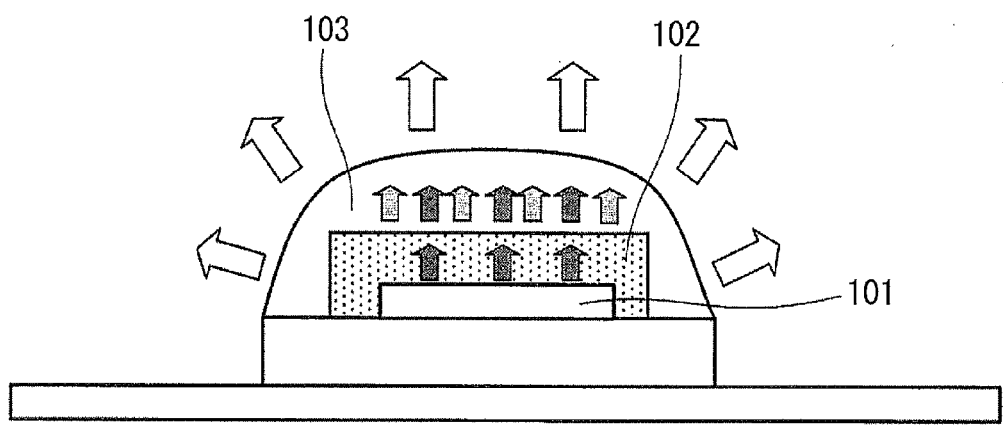
FIG. 12 is a cross-sectional view of a conventional lighting device.

FIG. 10 is a perspective view of a liquid-crystal display apparatus 2 including the surface light source 1 shown in FIG. 1. FIG. 11 a partial cross-sectional view of the liquid-crystal display apparatus 2 shown in FIG. 10, taken along the y-z plane including the optical axis of the lighting device. The liquid-crystal display apparatus 2 includes the surface light source 1, and a liquid crystal panel 50 disposed in front of the surface light source 1.

The lighting devices 10 arranged in a plane illuminate the diffusing plate 40. The diffusing plate 40 diffuses the irradiation light. The liquid crystal panel 50 is irradiated with the white light having a uniform illuminance.

Preferably, an optical sheet, such as a diffusion sheet and a prism sheet, is disposed between the liquid crystal panel 50 and the diffusing plate 40, although not shown in the figures. The light emitted from the lighting devices 10 is diffused by the diffusing plate 40, and returns to a lighting device side or transmits through the diffusing plate 40. The light returning to the lighting device side to enter the reflective layer 30 is reflected by the reflective layer 30 and enters the diffusing plate 40 once again. The light that has transmitted through the diffusing plate 40 is diffused further by the optical sheet and illuminates the liquid crystal panel 50.

So far, the embodiments have been described. It should be noted that the descriptions made above are examples of preferred embodiments of the present invention, and the scope of the present invention is not limited to these. More specifically, the descriptions with regard to the configurations and effects of the lighting device, the surface light source, and the liquid-crystal display apparatus are examples, and it apparently is possible to make various changes and additions to these examples within the scope of the present invention.

The present invention is suitable for liquid-crystal display apparatuses with reduced unevenness of color, backlights used in the liquid-crystal display apparatuses, and lighting devices used in the backlights.

The present invention can be applied to other embodiments that do not depart from its intention and essential features. The embodiments disclosed in this specification are explanatory in all senses and do not limit the present invention. The scope of the present invention is represented not by the above explanation but by accompanying claims, and encompasses all modifications which have a meaning and scope equivalent to the claims.

What is claimed is:

1. A lighting device comprising:
   a light emitting element that emits a first colored light;
   a phosphor layer that is disposed on the light emitting element and has a size allowing the phosphor layer to protrude around the light emitting element, the phosphor layer allowing a part of the first colored light to transmit therethrough and converting another part of the first colored light into a second colored light having a wavelength longer than that of the first colored light; and
   a lens part that is disposed so as to cover the light emitting element and the phosphor layer, and radiates light entering inside of the lens part so as to spread the light radially,
   wherein the lens part has: a base portion forming a light entrance surface through which the first colored light and the second colored light enter the lens part; and a diffraction portion forming a light exit surface through which the first colored light and the second colored light exit the lens part, the diffraction portion being configured so that a refracting power with respect to the second colored light is larger than a refracting power with respect to the first colored light.

2. The lighting device according to claim 1, wherein the second colored light is colored light that forms white light when mixed with the first colored light transmitting the phosphor layer.

3. The lighting device according to claim 1, wherein the lens part has a configuration in which the base portion and the diffraction portion are formed integrally.

4. The lighting device according to claim 1, wherein the lens part has a configuration in which the base portion and the diffraction portion are separate bodies.

5. The lighting device according to claim 2, wherein the first colored light is blue light and the second colored light is yellow light.

6. The lighting device according to claim 2, wherein the first colored light is blue light and the second colored light includes red light and green light.

7. The lighting device according to claim 1, wherein the lens part has a refractive index exceeding 1.40 but less than 1.52.

8. A surface light source comprising:
   a plurality of the lighting devices according to claim 1 arranged in a matrix or in a staggered manner; and
   a diffusing plate disposed so as to cover the lighting devices.

9. The surface light source according to claim 8, wherein when a pitch of the lighting devices is denoted as P and a distance from the light emitting element in the lighting device to the diffusing plate is denoted as H, the surface light source satisfies a formula below $0.2 < H/P < 0.6.$ 10. A liquid-crystal display apparatus comprising:
    a liquid crystal panel; and
    the surface light source according to claim 8 disposed behind the liquid crystal panel.

* * * * *